(12) United States Patent
Branchevsky

(10) Patent No.: US 6,252,761 B1
(45) Date of Patent: Jun. 26, 2001

(54) EMBEDDED MULTI-LAYER CERAMIC CAPACITOR IN A LOW-TEMPERATURE CON-FIRED CERAMIC (LTCC) SUBSTRATE

(75) Inventor: Shaul Branchevsky, Lake Forest, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 0 days.

(21) Appl. No.: 09/396,151

(22) Filed: Sep. 15, 1999

(51) Int. Cl.[7] .............................. H01G 4/06; H01G 4/228
(52) U.S. Cl. ...................................... 361/321.2; 361/306.3
(58) Field of Search .............................. 361/306.2, 306.3, 361/312, 313, 321.1, 321.2, 321.3, 322, 328

(56) References Cited

U.S. PATENT DOCUMENTS

| | | | |
|---|---|---|---|
| 4,082,906 | * | 4/1978 | Amin et al. ............................ 428/539 |
| 5,027,253 | * | 6/1991 | Lauffer et al. ...................... 361/321.2 |
| 5,736,448 | * | 4/1998 | Saia et al. ............................. 438/393 |
| 6,061,228 | * | 5/2000 | Palmer ................................ 361/306.2 |

OTHER PUBLICATIONS

Drue et al., "RF Models of Passive LTCC Components in the Lower Gigahertz–Range", Applied Microwave & Wireless, Apr. 1998, pp. 26–35.

Delaney et al., "Characterisation Of The Electrical Performance Of Buried Capacitors And Resistors In Low Temperature Co–Fired (LTCC) Ceramic", 1998 Electronic Components and Technology Conference, pp. 900–908.

Delaney et al., "Characterization and Performance Prediction for Integral Capacitors in Low Temperature Co–Fired Ceramic Technology", IEEE Transactions on Advanced Packaging, vol. 22, No. 1, Feb. 1999, pp. 68–77.

* cited by examiner

*Primary Examiner*—Anthony Dinkins
(74) *Attorney, Agent, or Firm*—Beyer Weaver & Thomas, LLP

(57) ABSTRACT

An apparatus for creating multi-layer embedded ceramic capacitors in low-temperature co-fired ceramic (LTCC) substrates. In order to create multiple layers of electrodes, the individual electrode layers must be connected electrically. According to the present invention, a multi-layer capacitor is formed on a first ceramic tape layer. A second tape layer having an opening is placed on top of the first layer. The opening in the second layer is formed such that exposed vias are present on at least two sides of the opening to electrically connect to the electrodes. When the tape layers are pressed and fired, the exposed vias and electrodes form common electrical connections. A third layer having a terminal via may be placed on top of the second layer.

17 Claims, 7 Drawing Sheets

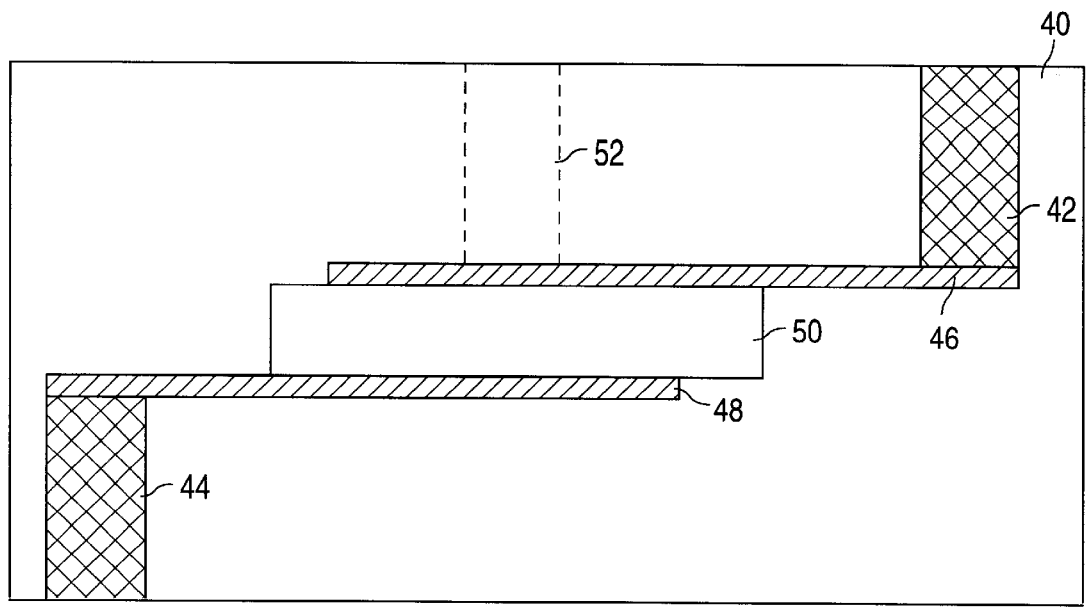
FIG. 4
(PRIOR ART)
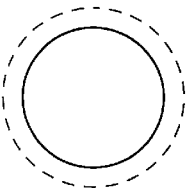 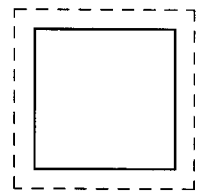 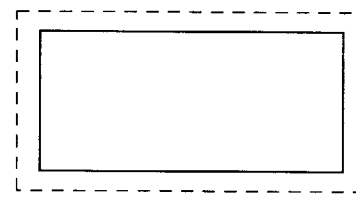
FIG. 5A
(PRIOR ART)
FIG. 5B
(PRIOR ART)
FIG. 5C
(PRIOR ART)
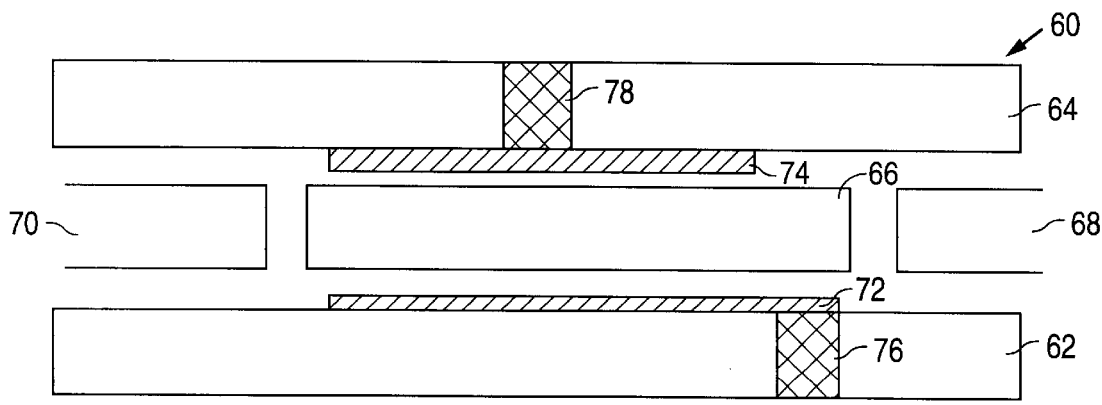
FIG. 6
(PRIOR ART)

EMBEDDED MULTI-LAYER CERAMIC CAPACITOR IN A LOW-TEMPERATURE CON-FIRED CERAMIC (LTCC) SUBSTRATE

BACKGROUND OF THE INVENTION

1. Field of the Invention

The present invention relates generally to the field of capacitors, and more particularly to embedded multi-layer capacitors formed in a low-temperature co-fired ceramic (LTCC) substrate.

2. Description of the Related Art

Conventionally, electronic circuit components, including silicon chips, have been mounted on printed circuit boards. More recently, in order to reduce the size associated with conventional printed circuit boards, low-temperature co-fired ceramic (LTCC) substrates have been used.

A typical LTCC configuration comprises multiple layers of ceramic "tape" which are used to provide the base structure upon which to form various electronic components and electrical connections. The tape is formed from a powdered ceramic, mixed with a binder. For example, one type of ceramic tape available from Dupont is known as "Green Tape 951." The electronic components that can be formed include resistors, capacitors, inductors and the like. The electrical connections, formed through each tape layer are known as "vias." The components are formed by punching holes in the tape as appropriate, and layering on metal, dielectrics, insulators, etc. Several layers of tape may be used in order to form the desired circuitry. The tape layers are then pressed together and fired in an oven to remove the binder and to sinter the ceramic powder. Components which are too large or too difficult to form within the ceramic tape layers, such as silicon chips, may be surface mounted on the hardened substrate. The resulting substrate is usually less than 1"×1" thus providing a compact circuit package.

FIG. 1 shows an example of the structure of a basic capacitor 10 formed within an LTCC substrate. A standard process to form this structure will now be described, with reference to FIG. 1. First, a hole is punched in a first tape layer 12 to form an opening. A silver, silver palladium, or similar paste is wiped across the hole to form a via 16, which is used as one terminal connection for the capacitor 10. Next, a first electrode 18 may be formed on top of the via 16 using silver, silver palladium or other similar electrode paste. After the electrode 18 has dried, a dielectric 20 is formed on top of the electrode 18. A dielectric paste is usually used, which when hardened, provides the desired dielectric properties. A second electrode 22 is then formed on top of the dielectric layer 20. These various component layers are commonly formed using a screen printing process. A second ceramic tape layer 14 having a via 24 is then pressed on top of the first layer 12. The second via 24 provides a second terminal for the capacitor 10. After the substrate is fired at 750–950° C., a capacitor structure 30 is formed as shown in FIG. 2. A top view of the capacitor structure 30 is shown in FIG. 3.

This procedure forms what is known in the art as a single layer ceramic capacitor (SLCC), also known as a mono-layer capacitor. Another embodiment of an SLCC is shown in FIG. 4. Specifically, the vias 42, 44 may be formed on the side of the electrodes 46,48, or with one via 42 in the middle of one electrode 46, and one via 44 on the side of the other electrode 48. The electrodes and dielectrics may also be formed as circles, squares or rectangles as shown in FIGS. 5(A)–5(C).

For standard capacitor configurations, the capacitance of a structure is determined according to the following formula: C=(kA)/t, where k is the dielectric constant of the dielectric material, A is the surface area of the electrodes, and t is the thickness of the dielectric, as shown in FIG. 7. Note that in FIG. 7, the dielectric area A and the electrode area A are presumed to be the same, but in practice the dielectric is usually made larger to ensure that the electrode layers do not touch. Thus, by changing the dielectric material, the capacitance value may be changed. FIG. 6 illustrates an SLCC in which a different dielectric is used, in order to change the capacitance. Instead of using a dielectric paste, the dielectric may be formed from a high temperature ceramic tape (1100–1400° C.). The high temperature tape 66 is fired separately, and then placed on the first electrode 72. The dielectric constant of the high temperature tape 66 is several orders of magnitude greater (k=20–20,000) than the dielectric constant of the standard tape (k=7–8) used to form the layers 62, 64. Standard tape 68,70 may be used around the dielectric to provide a constant thickness between the main layers 62, 64.

Two articles which discuss LTCC technology include "Characterization and Performance Prediction for Integral Capacitors in Low Temperature Co-Fired Ceramic Technology," Delaney et al., *IEEE Transactions on Advanced Packaging*, Vol. 22, No. 1, February 1999, pgs. 68–77; and "Characteristics of the Electrical Performance of Buried Capacitors and Resistors in Low Temperature Co-Fired (LTCC) Ceramic," Delaney et al., 1998 *Electronic Components and Technology Conference*, pgs. 900–908, the disclosures of which are herein incorporated by reference. While these articles seek to address the problem of providing capacitors with increased capacitance, the capacitors are still confined to being formed within a single layer of ceramic tape. The disclosed processes cannot make high capacitance capacitors and they require numerous types of dielectric materials in order to create different capacitances.

Since there is a practical limit to the dielectric constant that can be achieved, single layer capacitors do not provide sufficient capacitance within a reasonable area, for many applications. Thus, for high value capacitances, external capacitors are often surface mounted on the ceramic substrate. An example of one type of capacitor used for this purpose is shown in FIG. 8. Multiple layers of electrodes are formed in a discrete ceramic capacitor, and are used in order to increase the capacitance, while still providing a relatively small component. Adding external components, however, increases the costs associated with the LTCC circuit.

It would thus be desirable to have a multi-layer capacitor, embedded in the ceramic block, to reduce costs associated with manufacturing and attaching external capacitors, and to provide increased capacitance as compared to SLCCs.

SUMMARY OF THE INVENTION

In general, the present invention provides a unique structure for creating multi-layer embedded ceramic capacitors in low-temperature co-fired ceramic (LTCC) substrates. Specifically, in order to create multiple layers of electrodes, the individual electrode layers must be connected electrically. According to the present invention, a multi-layer capacitor is formed on a first ceramic tape layer. A second tape layer having an opening is placed on top of the first layer. The opening in the second layer is formed such that exposed vias are present on at least two sides of the opening to electrically connect to the electrodes. When the tape layers are pressed and fired, the exposed vias and electrodes form common electrical connections. A third layer having a terminal via may be placed on top of the second layer.

The present invention is not limited to any specific configuration of vias or openings, and numerous alternatives are envisoned, such as circular or rectangular openings, and cylindrical or rectangular block vias. Two capacitors may even be formed in the same opening, by having vias on four sides of the opening, and alternating the electrode layers. The dielectric layers may also be formed from different materials, providing different dielectric constants.

Thus, the present invention is not limited to any specific configuration or geometry of openings or vias, but the teachings encompass any structure having exposed vias connected to the edges of alternating layers of electrodes, in order to provide electrical connectivity.

BRIEF DESCRIPTION OF THE DRAWINGS

The present invention will be readily understood by the following detailed description in conjunction with the accompanying drawings, wherein like reference numerals designate like structural elements, and in which:

FIG. 4 is a diagram of an alternative embodiment of an SLCC according to the prior art;

FIGS. 5(A)–5(C) are diagrams of different configurations of the electrodes and dielectric layers of an SLCC according to the prior art;

FIG. 6 is a diagram of an SLCC according to the prior art having a high-temperature ceramic tape used as a dielectric;

DETAILED DESCRIPTION OF THE INVENTION

The following description is provided to enable any person skilled in the art to make and use the invention and sets forth the best modes contemplated by the inventor for carrying out the invention. Various modifications, however, will remain readily apparent to those skilled in the art, since the basic principles of the present invention have been defined herein specifically to provide an embedded multi-layer ceramic capacitor in a low-temperature co-fired ceramic (LTCC) substrate.

In general, the present invention provides a unique structure for creating multi-layer ceramic capacitors in LTCC substrates. Specifically, in order to create multiple layers of electrodes, the individual electrode layers must be connected electrically. The present invention solves the problem of electrically connecting the multiple electrode layers by providing exposed vias adjacent to the electrode layers to provide a common electrical connection.

Figure 1:
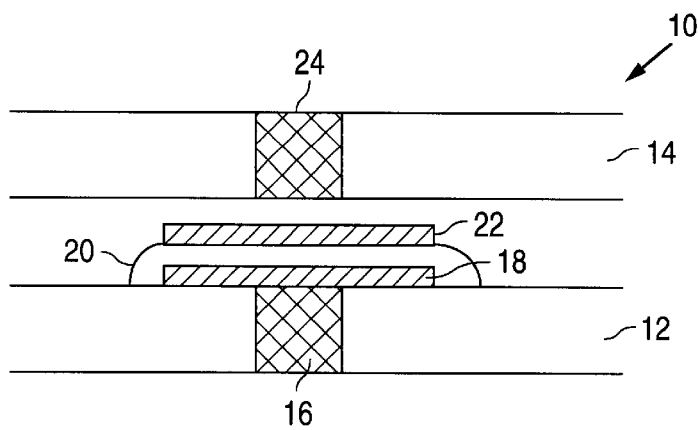
FIG. 1 is diagram of a prior art single layer ceramic capacitor (SLCC)
Figure 2:
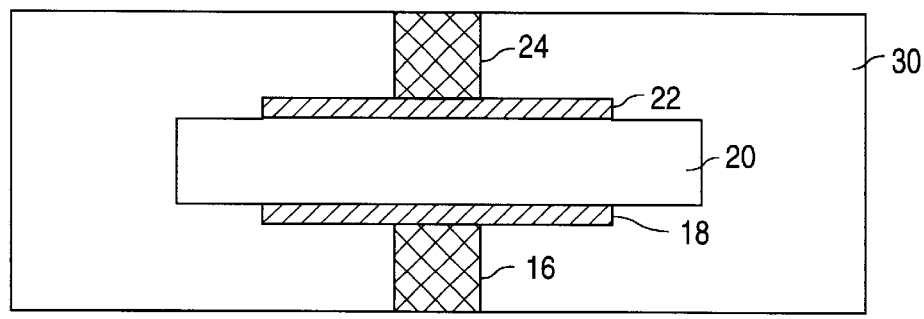
FIG. 2 is a diagram of the SLCC of FIG. 1 after the ceramic tape has been pressed and fired.
Figure 3:
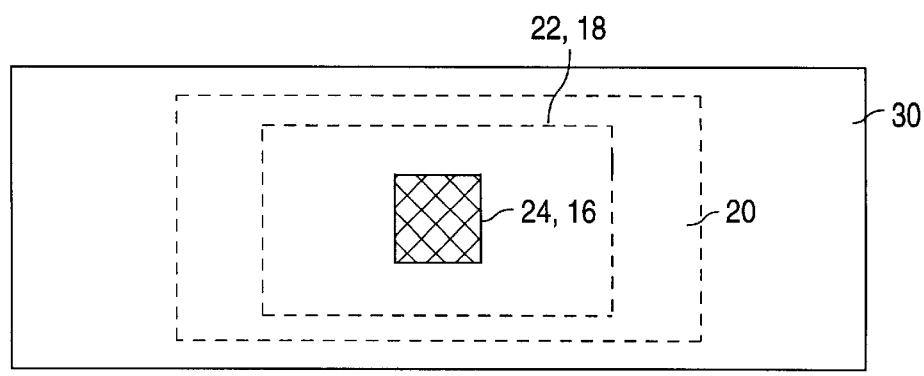
FIG. 3 is a top view of the capacitor of FIG. 2.
Figure 7:
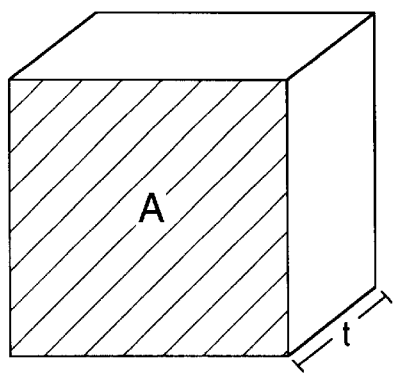
FIG. 7 is a prior art diagram illustrating the area and thickness variables as used in the standard capacitance formula.
Figure 8:
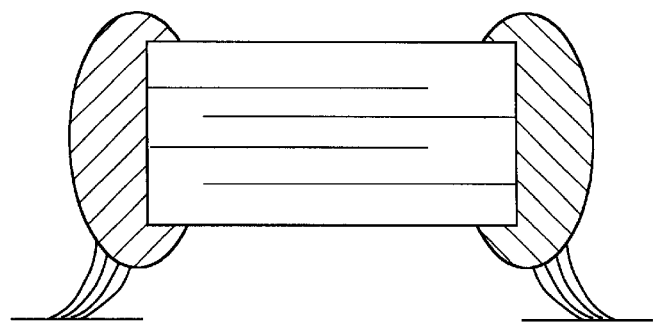
FIG. 8 is a diagram of a prior art, discrete ceramic multi-layer capacitor suitable for surface mounting on an LTCC substrate.
Figure 9:
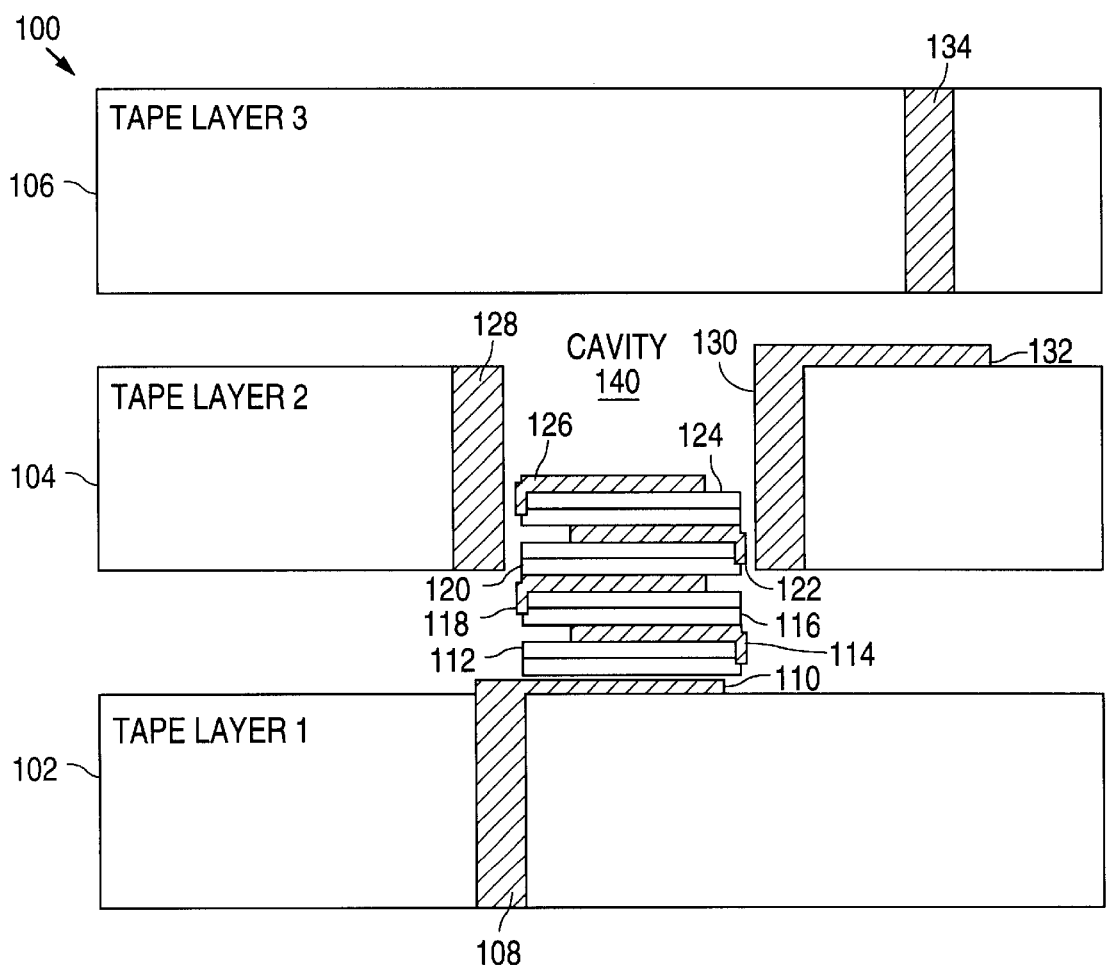
FIG. 9 is a diagram illustrating an embedded multi-layer LTCC formed according to a preferred embodiment of the present invention.
Figure 10:
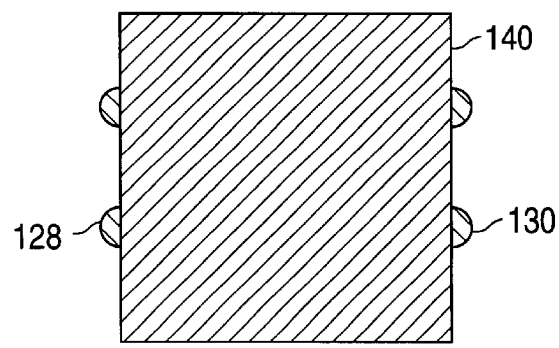
FIG. 10 is a diagram illustrating an opening in a tape layer suitable for use with the present invention.

A preferred embodiment of the present invention is illustrated in FIG. 9. An embedded multi-layer ceramic capacitor 100 is formed using three ceramic tape layers 102, 104, 106. In a standard LTCC substrate, additional layers are used to form additional circuitry. These additional layers are omitted from the discussion herein for clarity. The first tape layer 102 is formed with a via 108 in the conventional manner. The second layer 104, however, is first formed with appropriately spaced vias 128, 130 which are then punched through to expose a cross-section thereof FIG. 10 shows a top view of one embodiment of the second layer 104 that may be used for the multi-layer ceramic capacitor structure 100. Note that in FIG. 10 the cylindrical vias 128, 130 are bisected by an opening 140 created in the tape layer 104. Many other configurations are easily envisioned and are within the scope of the present invention. For example, the vias may be formed as rectangular blocks, with the opening exposing a side surface of each via, without necessarily bisecting the blocks. Also, in the preferred embodiment, two vias are bisected on each side of the opening 140, though only one via per side may be used.

The opening 140 in the second layer 104 provides a cavity in which to build the multiple electrode and dielectric layers needed to form a multi-layer capacitor. Specifically, as shown in FIG. 9, a first electrode layer 110 is formed on top of the first tape layer 102, overlapping the via 108. Alternating layers of dielectric material 112, 116, 120, 124 and electrodes 114, 118, 122, 126 are then formed on top of the first electrode layer 10. The electrode layers 114, 118, 122, 126 are formed so that each successive layer corresponds to an alternate terminal. In other words, layers 110, 118 and 126 form a first set of electrodes, which connect to the via 108 in the first tape layer 102. The remaining electrode layers 114 and 122 form a second set of electrodes, which connect to the via 134 in the third tape layer 106. The two vias 108, 134 thus correspond to the standard two terminals of a standard capacitor.

Figure 11:
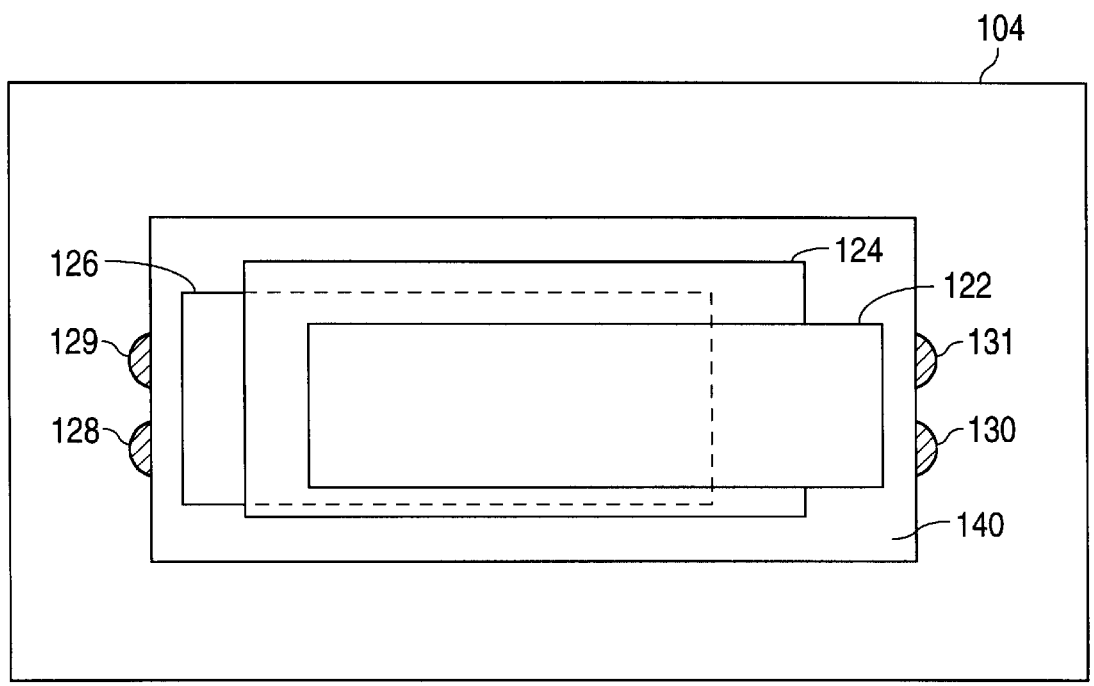
FIG. 11 is a top view of the capacitor of FIG. 9.
Figure 12:
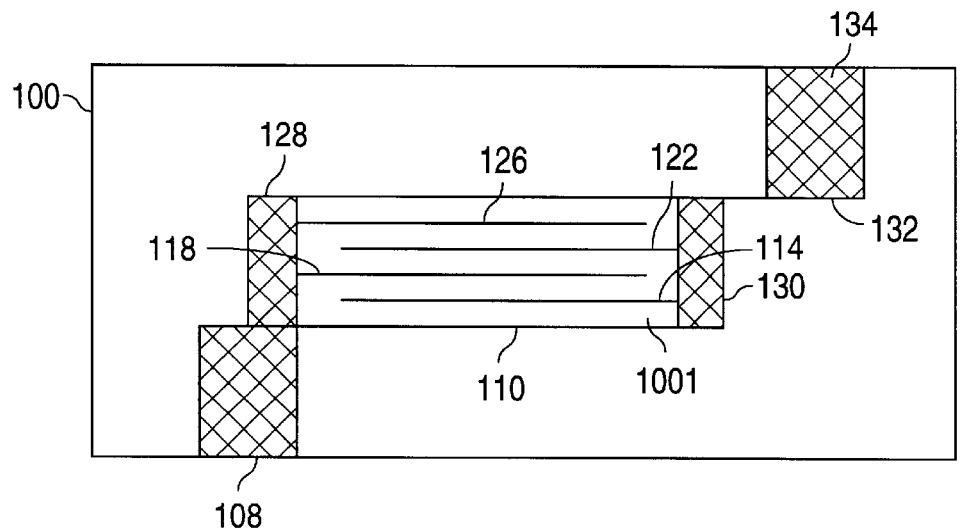
FIG. 12 is a side view of the capacitor of FIG. 9, after firing.

An individual electrode layer 114 is formed such that one end is exposed past the underlying dielectric layer 112 to connect to the adjacent exposed via 130, while the other end of the electrode 114 is formed to ensure that it does not connect to the adjacent exposed via 128. By alternating the just described electrode configuration, each electrode layer is electrically connected to an alternating exposed via An electrical connection is formed on top of the second tape layer 104 to connect to the via 134 in the third tape layer 106. The exposed vias 128, 130 thus provide electrical connections for alternating sets of electrodes, allowing multi-layer ceramic capacitors to be formed within an LTCC substrate. When the tape layers 102, 104, 106 (and any additional LTCC layers) are pressed together and oven-fired, the silver paste (or other similar material) used to the form the exposed vias 128, 130 and electrode layers 110, 114, 118, 122, 126 flows and joins together forming a permanent electrical connection. FIG. 11 illustrates a top view of the capacitor structure 100 illustrated in FIG. 9. FIG. 12 is a side view of the capacitor of FIG. 9, showing the structure after it has been pressed and fired. Notice that the dielectric material 1001 is now disposed between and around the electrodes such that the opening 140 no longer exists.

Although the preferred embodiment has been described with reference to four layers, a capacitor may be formed having greater or fewer layers. Additional tape layers may also be added between the first 102 and third 106 tape layers to provide more volume in which to build the capacitor layers. These additional tape layers are basically formed as duplicates of the second tape layer 104, with an opening punched exposing vias on the side, in which the vias provide electrical connections for the alternating layers of electrodes, and with the other tape layer(s).

Figure 16:
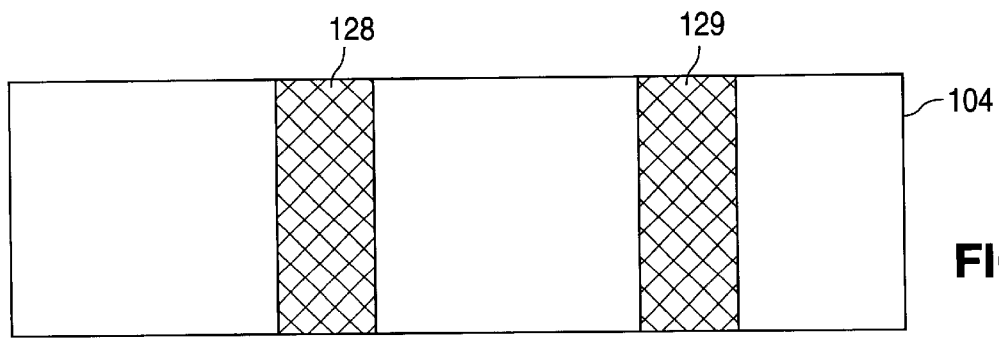
FIG. 16 is a diagram of a cross-section of a tape layer showing the bisected, exposed vias.

In the preferred embodiment, the opening 140 in the second tape layer is formed using a mechanical punch to remove the ceramic tape and expose the vias. A cross-section of one end of an opening is illustrated in FIG. 16 showing the exposed bisected vias 128, 129. Any other methods known to those skilled in the art to remove the ceramic tape may be also be used. Additionally, for capacitors having many layers, a standard screen printing process may damage the structure as the layers are being built. To overcome this problem, sidewalls formed from ceramic tape may be used to facilitate the construction of the capacitor. The sidewalls are then removed before adding the second and third tape layers.

In the preferred embodiment, the dielectric layers are formed using a standard dielectric paste, however, the dielectric layers may be formed using fired high-temperature ceramic tape, as well as any other dielectric material commonly used in the art. There is no requirement that the same dielectric material be used for each layer, or even that the dielectric layers have the same thickness. In fact, the electrodes themselves may have different sizes, thickness, or have a different alternating pattern than those specifically described herein.

Figure 13H:
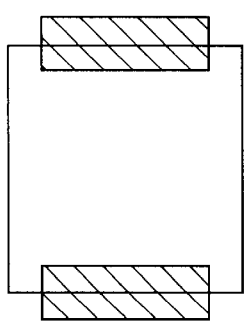
FIGS. 13(A)—13(J) illustrate top views of various alternative embodiments of the vias and openings for a capacitor according to the present invention.
Figure 13I:
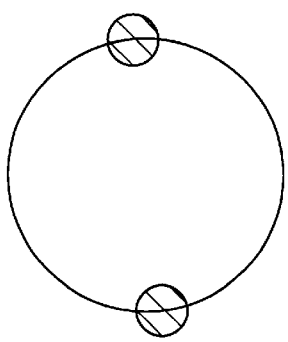
Figure 13J:
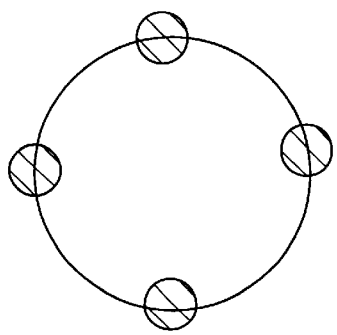
Figure 13E:
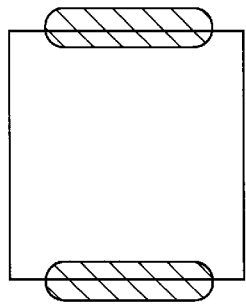
Figure 13F:
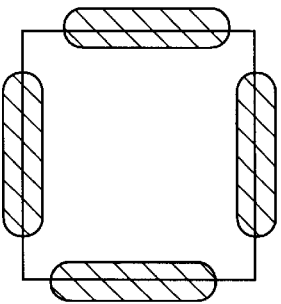
Figure 13G:
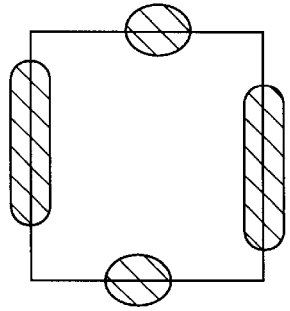
Figure 13A:
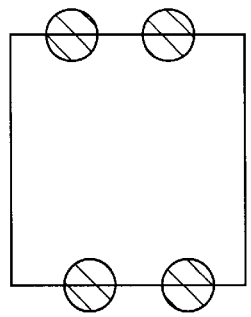
Figure 13B:
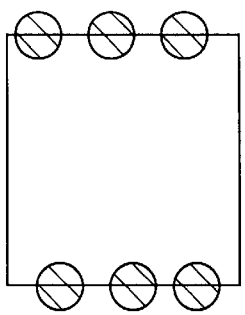
Figure 13C:

As mentioned above, in the preferred embodiment the vias in the second tape layer 104 are formed as cylinders and are bisected with a square opening 140. As shown in FIGS. 13(A)–13(J) (top views), however, numerous alternate embodiments may also be configured. Specifically, FIGS. 13(A)–13(C) illustrate that one, two or three cylindrical vias may be used on each side of the opening. FIG. 13(I) illustrates an embodiment wherein the opening is round instead of square, with the associated electrode and dielectric layers formed as circles to fit within the rounded opening. FIGS. 13(E) and 13(H) illustrate embodiments in which the vias are wider, providing greater surface area to contact the electrodes.

These embodiments illustrate that the vias are generally bisected, but more or less of the via may be removed by the punching process without departing from the scope of the present invention. In fact, in a configuration in which the vias have a flat-facing surface (as viewed from the opening), only enough of the ceramic tape needs to be removed as will expose the surface of the vias. Thus, the present invention is not limited to any specific configuration or geometry of openings or vias, but is deemed to encompass any structure having exposed vias connected to the edges of alternating layers of electrodes, in order to provide electrical connectivity.

Figure 14:
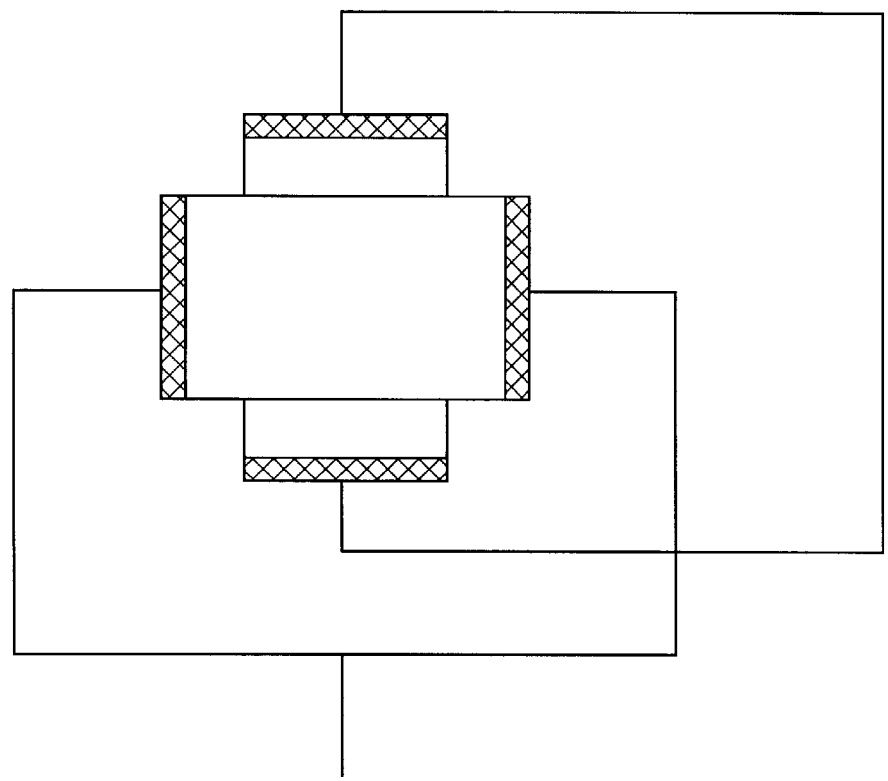
FIG. 14 is a diagram of two capacitors formed within a single opening.

FIGS. 13(D), 13(F), 13(G), and 13(J) illustrate several possible configurations for creating two different capacitors within the same opening, by using vias on each side of the opening. These configurations will now be explained further with reference to FIGS. 14 and 15. In FIG. 14, corresponding to the via structure of FIG. 13(F), two separate capacitors are formed within the same opening. By orienting the capacitors' electrodes 90° to each other, the configuration provides better performance at high frequencies for certain design applications. Also, the effective surface are for one capacitor structure may be different than the area for the second structure. This allows two capacitors to be formed in a single opening, providing a significant size advantage as compared to the SLCC designs of the prior art.

Figure 13D:
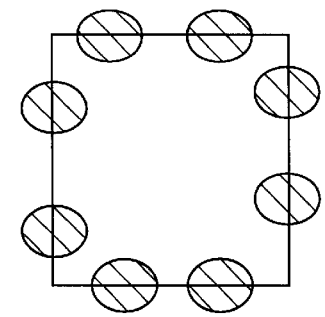
Figure 15:
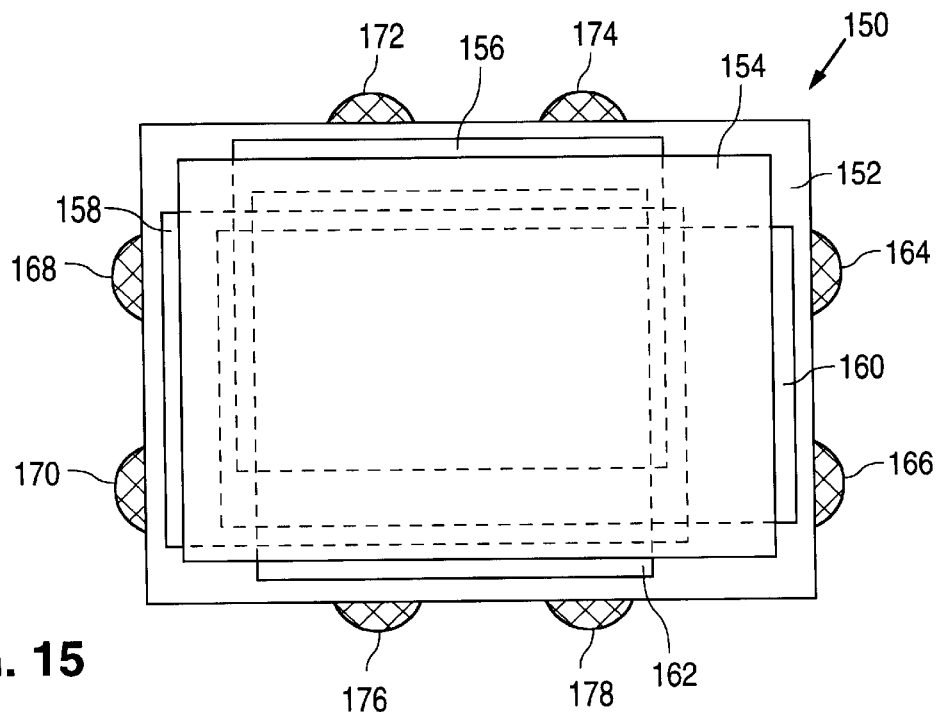
FIG. 15 is a diagram of two capacitors formed within a single opening, with each electrode having a different surface area.
Figure 17:
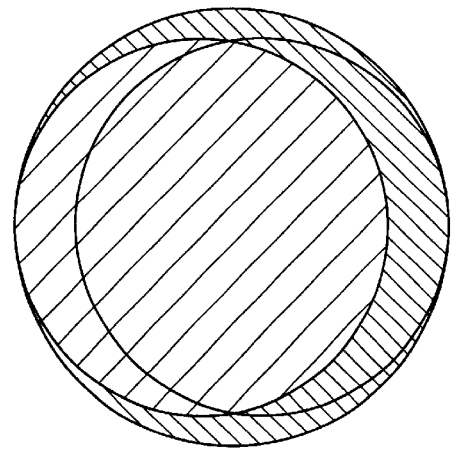
FIG. 17 is a diagram illustrating an embodiment of the present invention in which the electrodes and dielectric layers are round.

FIG. 15, corresponding to the via structure of FIG. 13(D), illustrates that four different electrode sizes may be interleaved as desired to provide two different capacitances within a single opening 152. Specifically, two sets of electrodes 156, 158 may be formed at right angles corresponding to a first capacitor. Two additional sets of electrodes 160, 162 are also formed in the same opening 152. Dielectric layers 154 are inter-spaced between the electrode layers. Each set of electrodes has a corresponding set of vias. This structure provides significant space savings over the previously utilized SLCC. Those skilled in the art will appreciate that many other configurations other than those specifically described herein may be formed utilizing the basic teachings of the present invention. For example, the electrodes and dielectrics may be shaped as necessary to fit any desired shape of opening such as a circle. A circular embodiment is illustrated in FIG. 17.

Those skilled in the art will appreciate that various adaptations and modifications of the just-described preferred embodiments can be configured without departing from the scope and spirit of the invention. The present invention, in general, is an apparatus and method for forming an embedded multi-layer capacitor in an LTCC substrate by creating an opening in a tape layer having exposed vias connected to the edges of alternating layers of electrodes, formed within the opening, in order to provide electrical connectivity. Therefore, it is to be understood that, within the scope of the appended claims, the invention may be practiced other than as specifically described herein.

What is claimed is:

1. An embedded multi-layer capacitor formed in a low-temperature co-fired ceramic (LTCC) substrate, the capacitor comprising:
    a first ceramic tape layer having a first via;
    at least two electrodes formed on the first ceramic tape layer, each electrode separated by a dielectric layer; and
    a second ceramic tape layer have an opening, the opening having at least two exposed vias, the second ceramic tape layer placed on the first ceramic tape layer such that the electrodes fit within the opening and each electrode is adjacent to at least one exposed via.

2. The capacitor of claim 1, wherein the capacitor comprises a third ceramic tape layer having a second via.

3. The capacitor of claim 2, further comprising a plurality of tape of layers, each having an opening with at least two exposed vias, placed between the second and third tape layers.

4. The capacitor of claim 2, wherein a first exposed via connects to a first set of electrodes and a second exposed via connects to a second set of electrodes.

5. The capacitor of claim 4, wherein the opening is formed by punching a hole in the second ceramic tape layer, the hole bisecting vias previously formed in the second ceramic tape layer.

6. The capacitor of claim 5, wherein the vias are either cylinders or rectangular blocks.

7. The capacitor of claim 4, wherein the first set of electrodes are connected to a plurality of vias and the second set of electrodes are connected to a plurality of vias.

8. The capacitor of claim 4, wherein each electrode is formed to connect to a via in the opening.

9. The capacitor of claim 8, wherein the via in the opening connected to the first set of electrodes is connected to the via in the first tape layer, and the via in the opening connected to the second set of electrodes is connected to a via in a third tape layer.

10. The capacitor of claim 4, further comprising:
    at least two additional exposed vias formed in the opening of the second tape layer;
    a third set of electrodes formed on the first tape layer; and
    a fourth set of electrodes formed on the second tape layer;
    wherein the third and fourth tape sets of electrodes connect to the at least two multi-layer capacitors formed within the opening.

11. The capacitor of claim 9, wherein the ceramic tape is a low-temperature co-fired ceramic (LTCC) tape.

12. The capacitor of claim 11, wherein the dielectric is formed from a dielectric paste.

13. The capacitor of claim 11, wherein the dielectric is formed from a high temperature ceramic tape.

14. An embedded multi-layer capacitor structure formed in a low-temperature co-fired ceramic (LTCC) substrate, the capacitor structure comprising:
    a first ceramic tape layer having a first via;
    a multi-layer capacitor, having a plurality of layers of electrodes separated by dielectric layers, formed on the first ceramic tape layer;
    a second ceramic tape layer have an opening, the opening having at least two exposed vias, the second ceramic tape layer placed on the first ceramic tape layer such that the multi-layer capacitor fits within the opening and each of the electrode layers is adjacent to at least one exposed via; and
    a third ceramic tape layer, having a second via, placed on the second ceramic tape layer.

15. The capacitor structure of claim 14, wherein the exposed vias are on opposite sides of the opening.

16. The capacitor structure of claim 15, further comprising a second multi-layer capacitor formed within the opening, the second capacitor having layers formed between the layers of the first capacitor.

17. A low-temperature co-fired ceramic (LTCC) substrate comprising:
    a first ceramic tape layer having a first via;
    at least two electrodes formed on the first ceramic tape layer, each electrode separated by a dielectric layer; and
    a second ceramic tape layer have an opening, the opening having at least two exposed vias, the second ceramic tape layer placed on the first ceramic tape layer such that the electrodes fit within the opening and each electrode is adjacent to at least one exposed via.

* * * * *

UNITED STATES PATENT AND TRADEMARK OFFICE
CERTIFICATE OF CORRECTION

PATENT NO. : 6,252,761 B1
DATED : June 26, 2001
INVENTOR(S) : Shaul Branchevsky

It is certified that error appears in the above-identified patent and that said Letters Patent is hereby corrected as shown below:

<u>Title page,</u>
Item [54], ABSTRACT, "EMBEDDED MULTI-LAYER CERAMIC CAPACITOR IN A LOW-TEMPERATURE CON-FIRED CERAMIC (LTCC) SUBSTRATE" should read -- EMBEDDED MULTI-LAYER CERAMIC CAPACITOR IN A LOW-TEMPERATURE CO-FIRED CERAMIC (LTCC) SUBSTRATE --.

<u>Column 1,</u>
Lines 1-3, "EMBEDDED MULTI-LAYER CERAMIC CAPACITOR IN A LOW-TEMPERATURE CON-FIRED CERAMIC (LTCC) SUBSTRATE" should read -- EMBEDDED MULTI-LAYER CERAMIC CAPACITOR IN A LOW-TEMPERATURE CO-FIRED CERAMIC (LTCC) SUBSTRATE --.

Signed and Sealed this

Twenty-sixth Day of February, 2002

*Attest:*

JAMES E. ROGAN
*Attesting Officer*    *Director of the United States Patent and Trademark Office*